(12) United States Patent
Fee

(10) Patent No.: US 7,745,944 B2
(45) Date of Patent: Jun. 29, 2010

(54) MICROELECTRONIC DEVICES HAVING INTERMEDIATE CONTACTS FOR CONNECTION TO INTERPOSER SUBSTRATES, AND ASSOCIATED METHODS OF PACKAGING MICROELECTRONIC DEVICES WITH INTERMEDIATE CONTACTS

(75) Inventor: Setho Sing Fee, Singapore (SG)

(73) Assignee: Micron Technology, Inc., Boise, ID (US)

( * ) Notice: Subject to any disclaimer, the term of this patent is extended or adjusted under 35 U.S.C. 154(b) by 1050 days.

(21) Appl. No.: 11/217,629

(22) Filed: Aug. 31, 2005

(65) Prior Publication Data

US 2007/0045872 A1 Mar. 1, 2007

(51) Int. Cl.
*H01L 23/52* (2006.01)
(52) U.S. Cl. ............... 257/787; 257/738; 257/E23.021; 257/E23.069; 257/E21.508; 257/678; 257/679; 257/680; 257/690; 257/730; 257/733; 257/E23.001; 257/E23.194; 257/91; 257/177; 257/182
(58) Field of Classification Search ................. 257/737, 257/738, E23.021, E23.069, E21.508, 678, 257/679, 680, 689, 690, 733, 787, 796, E23.001, 257/E23.194, 82, 91, 177, 182
See application file for complete search history.

(56) References Cited

U.S. PATENT DOCUMENTS

| 5,128,831 | A | 7/1992 | Fox, III et al. |
|---|---|---|---|
| 5,252,857 | A | 10/1993 | Kane et al. |
| 5,518,957 | A | 5/1996 | Kim |
| 5,593,927 | A | 1/1997 | Farnworth et al. |
| 5,677,566 | A | 10/1997 | King et al. |
| 5,696,033 | A | 12/1997 | Kinsman |
| 5,739,585 | A | 4/1998 | Akram et al. |
| D394,844 | S | 6/1998 | Farnworth et al. |
| D402,638 | S | 12/1998 | Farnworth et al. |
| 5,851,845 | A | 12/1998 | Wood et al. |
| 5,883,426 | A | 3/1999 | Tokuno et al. |
| 5,891,753 | A | 4/1999 | Akram |

(Continued)

FOREIGN PATENT DOCUMENTS

EP 0 993 043 A2 4/2000

(Continued)

OTHER PUBLICATIONS

International Search Report and Written Opinion for International Application No. PCT/US2006/031287, 15 pages, mailed Jan. 22, 2007.

(Continued)

*Primary Examiner*—Wael fahmy
*Assistant Examiner*—Marc Armand
(74) *Attorney, Agent, or Firm*—Perkins Coie LLP

(57) ABSTRACT

Microelectronic devices having intermediate contacts, and associated methods of packaging microelectronic devices with intermediate contacts, are disclosed herein. A packaged microelectronic device configured in accordance with one embodiment of the invention includes a microelectronic die attached to an interconnecting substrate. The microelectronic die includes an integrated circuit electrically coupled to a plurality of terminals. Each of the terminals is electrically coupled to a corresponding first contact on the die with an individual wire-bond. Each of the first contacts on the die is electrically coupled to a corresponding second contact on the interconnecting substrate by a conductive coupler such as a solder ball.

13 Claims, 5 Drawing Sheets

U.S. PATENT DOCUMENTS

| | | |
|---|---|---|
| 5,893,726 A | 4/1999 | Farnworth et al. |
| 5,898,224 A | 4/1999 | Akram |
| 5,933,713 A | 8/1999 | Farnworth |
| 5,938,956 A | 8/1999 | Hembree et al. |
| 5,946,553 A | 8/1999 | Wood et al. |
| 5,958,100 A | 9/1999 | Farnworth et al. |
| 5,986,209 A | 11/1999 | Tandy |
| 5,989,941 A | 11/1999 | Wensel |
| 5,990,566 A | 11/1999 | Farnworth et al. |
| 5,994,784 A | 11/1999 | Ahmad |
| RE36,469 E | 12/1999 | Wood et al. |
| 6,008,070 A | 12/1999 | Farnworth |
| 6,008,074 A | 12/1999 | Brand |
| 6,020,624 A | 2/2000 | Wood et al. |
| 6,020,629 A | 2/2000 | Farnworth et al. |
| 6,025,728 A | 2/2000 | Hembree et al. |
| 6,028,365 A | 2/2000 | Akram et al. |
| 6,046,496 A | 4/2000 | Corisis et al. |
| 6,048,744 A | 4/2000 | Corisis et al. |
| 6,048,755 A | 4/2000 | Jiang et al. |
| 6,049,125 A | 4/2000 | Brooks et al. |
| 6,051,878 A | 4/2000 | Akram et al. |
| 6,072,233 A | 6/2000 | Corisis et al. |
| 6,072,236 A | 6/2000 | Akram et al. |
| 6,075,288 A | 6/2000 | Akram |
| 6,097,087 A | 8/2000 | Farnworth et al. |
| 6,103,547 A | 8/2000 | Corisis et al. |
| 6,107,122 A | 8/2000 | Wood et al. |
| 6,107,680 A | 8/2000 | Hodges |
| 6,117,382 A | 9/2000 | Thummel |
| 6,124,634 A | 9/2000 | Akram et al. |
| 6,144,102 A * | 11/2000 | Amagai ............... 257/781 |
| 6,150,717 A | 11/2000 | Wood et al. |
| 6,159,764 A | 12/2000 | Kinsman et al. |
| 6,172,419 B1 | 1/2001 | Kinsman |
| 6,175,149 B1 | 1/2001 | Akram |
| 6,184,465 B1 | 2/2001 | Corisis |
| 6,198,172 B1 | 3/2001 | King et al. |
| 6,208,519 B1 | 3/2001 | Jiang et al. |
| 6,210,992 B1 | 4/2001 | Tandy et al. |
| 6,212,767 B1 | 4/2001 | Tandy |
| 6,215,175 B1 | 4/2001 | Kinsman |
| 6,225,689 B1 | 5/2001 | Moden et al. |
| 6,228,548 B1 | 5/2001 | King et al. |
| 6,229,202 B1 | 5/2001 | Corisis |
| 6,235,554 B1 | 5/2001 | Akram et al. |
| 6,246,108 B1 | 6/2001 | Corisis et al. |
| 6,252,308 B1 | 6/2001 | Akram et al. |
| 6,258,623 B1 | 7/2001 | Moden et al. |
| 6,258,624 B1 | 7/2001 | Corisis |
| 6,259,153 B1 | 7/2001 | Corisis |
| 6,277,671 B1 | 8/2001 | Tripard |
| 6,281,577 B1 | 8/2001 | Oppermann et al. |
| 6,284,571 B1 | 9/2001 | Corisis et al. |
| 6,291,894 B1 | 9/2001 | Farnworth et al. |
| 6,294,839 B1 | 9/2001 | Mess et al. |
| 6,297,547 B1 | 10/2001 | Akram |
| 6,303,981 B1 | 10/2001 | Moden |
| 6,303,985 B1 | 10/2001 | Larson et al. |
| 6,310,390 B1 | 10/2001 | Moden |
| 6,314,639 B1 | 11/2001 | Corisis |
| 6,316,285 B1 | 11/2001 | Jiang et al. |
| 6,326,242 B1 | 12/2001 | Brooks et al. |
| 6,326,244 B1 | 12/2001 | Brooks et al. |
| 6,326,687 B1 | 12/2001 | Corisis |
| 6,326,697 B1 | 12/2001 | Farnworth |
| 6,326,698 B1 | 12/2001 | Akram |
| 6,329,220 B1 | 12/2001 | Bolken et al. |
| 6,331,221 B1 | 12/2001 | Cobbley |
| 6,331,453 B1 | 12/2001 | Bolken et al. |
| 6,332,766 B1 | 12/2001 | Thummel |
| 6,365,434 B1 | 4/2002 | Rumsey et al. |
| 6,429,528 B1 | 8/2002 | King et al. |
| 6,451,709 B1 | 9/2002 | Hembree |
| 6,548,376 B2 | 4/2003 | Jiang |
| 6,548,757 B1 | 4/2003 | Russell et al. |
| 6,552,910 B1 | 4/2003 | Moon et al. |
| 6,558,600 B1 | 5/2003 | Williams et al. |
| 6,560,117 B2 | 5/2003 | Moon et al. |
| 6,561,479 B1 | 5/2003 | Eldridge |
| 6,564,979 B2 | 5/2003 | Savaria |
| 6,576,494 B1 | 6/2003 | Farnworth |
| 6,576,495 B1 | 6/2003 | Jiang et al. |
| 6,589,820 B1 | 7/2003 | Bolken |
| 6,602,803 B2 * | 8/2003 | Yew et al. ............... 438/780 |
| 6,607,937 B1 | 8/2003 | Corisis |
| 6,614,092 B2 | 9/2003 | Eldridge et al. |
| 6,622,380 B1 | 9/2003 | Grigg |
| 6,624,507 B1 | 9/2003 | Nguyen et al. |
| 6,638,595 B2 | 10/2003 | Rumsey et al. |
| 6,644,949 B2 | 11/2003 | Rumsey et al. |
| 6,653,173 B2 | 11/2003 | Bolken |
| 6,670,719 B2 | 12/2003 | Eldridge et al. |
| 6,672,325 B2 | 1/2004 | Eldridge |
| 6,673,649 B1 | 1/2004 | Hiatt et al. |
| 6,803,659 B2 | 10/2004 | Suwa et al. |
| 6,838,760 B1 | 1/2005 | Cobbley |
| 7,224,055 B2 * | 5/2007 | Kim et al. ............... 257/686 |
| 2004/0031621 A1 | 2/2004 | Heng |
| 2004/0090829 A1 | 5/2004 | Miura et al. |
| 2004/0214373 A1 | 10/2004 | Jiang et al. |
| 2005/0017372 A1 | 1/2005 | Lua et al. |

FOREIGN PATENT DOCUMENTS

| | | |
|---|---|---|
| JP | 09-129675 A | 5/1997 |
| JP | 10-093017 A | 4/1998 |
| JP | 2004-340599 A | 12/2004 |
| TW | 552652 B | 9/2003 |
| TW | 586211 B | 5/2004 |
| TW | 200407790 A | 5/2004 |

OTHER PUBLICATIONS

Search Report and Examination Report for Singapore Application No. 200505616-3, issued Jun. 9, 2008.

Office Action issued Feb. 23, 2010 in Korea Application No. 10-2008-7005728.

Office Action issued Jan. 29, 2010 in Taiwan Application No. 095130919.

* cited by examiner

MICROELECTRONIC DEVICES HAVING INTERMEDIATE CONTACTS FOR CONNECTION TO INTERPOSER SUBSTRATES, AND ASSOCIATED METHODS OF PACKAGING MICROELECTRONIC DEVICES WITH INTERMEDIATE CONTACTS

TECHNICAL FIELD

The following disclosure relates generally to packaging microelectronic devices and, more particularly, to methods for electrically coupling microelectronic dies to interposer substrates.

BACKGROUND

Conventional die-level packaged microelectronic devices typically include a microelectronic die, an interposer substrate or lead frame attached to the die, and a moulded casing around the die. The die generally includes an integrated circuit coupled to a plurality of bond-pads. The bond-pads are typically coupled to contacts on the interposer substrate or lead frame, and serve as external electrical contacts through which supply voltage, signals, etc., are transmitted to and from the integrated circuit. In addition to contacts, interposer substrates can also include ball-pads coupled to the contacts by conductive traces supported in a dielectric material. Solder balls can be attached to the ball-pads in one-to-one correspondence to define a "ball-grid array." Packaged microelectronic devices with ball-grid arrays are generally higher grade packages that have lower profiles and higher pin counts than conventional packages using lead frames.

One process for making a packaged microelectronic device with a ball-grid array includes (a) forming a plurality of dies on a semiconductor wafer, (b) cutting the wafer to separate or singulate the dies, (c) attaching individual dies to an interposer substrate, (d) wire-bonding bond-pads on the dies to contacts on the interposer substrate, and (e) encapsulating the dies with a suitable moulding compound. Packaged microelectronic devices made in the foregoing manner are often used in cellphones, pagers, personal digital assistants, computers, and other electronic products. As the demand for these products grows, there is a continuing drive to increase the performance of packaged microelectronic devices while at the same time reducing the height and surface area or "footprint" of such devices on printed circuit boards. Reducing the size of microelectronic devices, however, becomes more difficult as the performance increases because higher performance typically requires more integrated circuitry and bond-pads.

FIG. 1 is a partially cut-way isometric view of a packaged microelectronic device 100 configured in accordance with the prior art. The packaged microelectronic device 100 includes a microelectronic die 110 attached to an interconnecting substrate 120 in a conventional board-on-chip (BOC) arrangement. The microelectronic die 110 includes an integrated circuit 116 electrically coupled to a plurality of terminals (e.g., bond-pads) 112. Each of the terminals 112 is electrically coupled to a corresponding bond-finger or contact 122 on the interconnecting substrate 120 by an individual wire-bond 114. Each of the contacts 122 is in turn electrically connected to a corresponding ball-pad 126 by a conductive line or trace 124 formed on the surface of the substrate 120. After the electrical connections have been made, the microelectronic die 110 can be encapsulated with a suitable mold compound 140 for protection. Solder balls (not shown) can be attached to the ball-pads 126 in one-to-one correspondence to form a ball-grid array for attaching the packaged microelectronic device 100 to a printed circuit board (PCB), printed wiring assembly (PWA), and/or other electronic interfaces (not shown).

As the performance of the microelectronic die 110 increases, the number of terminals 112 also increases. Combining this with the trend to make the die 110 smaller results in a very fine-pitch array of terminals 112 on the die 110. Providing enough contacts 122 and traces 124 to accommodate the terminals 112 causes the surface of the interconnecting substrate 112 to become very congested near the die 110. At some point, the surface of the substrate 120 will become so congested that it will no longer be possible to add any additional contacts or traces. This constraint limits the ability to shrink the microelectronic device 100 further, especially if the performance of the die 110 increases.

FIG. 2 is a partially cut-away isometric view of another packaged microelectronic device 200 configured in accordance with the prior art. The packaged microelectronic device 200 includes a microelectronic die 210 bonded to an interconnecting substrate 220 in a conventional chip-on-board (COB) arrangement. The microelectronic die 210 includes an integrated circuit 216 electrically coupled to a plurality of first terminals 212a and a plurality of second terminals 212b. As shown, the first terminals 212a are arranged along one side of the die 210 and the second terminals 212b are arranged along the other side of the die 210. Each of the terminals 212 is electrically connected to a corresponding contact 222 on the interconnecting substrate 220 by an individual wire-bond 214. Each of the contacts 222 is in turn electrically coupled to a corresponding ball-pad 226 by a conductive line 224. In the conventional COB arrangement illustrated in FIG. 2, the ball-pads 226 are located on a back surface of the interconnecting substrate 220, and a portion of each conductive line 224 extends through the substrate 220 to reach the corresponding ball-pad 226. After all the electrical connections have been made, the microelectronic 210 is encased in a suitable mold compound 240.

Many of the congestion problems discussed above with reference to FIG. 1 also apply to the packaged microelectronic device 200 illustrated in FIG. 2. For example, as the performance of the microelectronic die 210 increases, the number of terminals 212 and other die components also increases. As a result, the common way to reduce the overall size of the packaged device 200 is to reduce the size of the interconnecting substrate 220. As the interconnecting substrate 220 becomes smaller, however, the contacts 222 need to be smaller and more compressed because the area to accommodate them is reduced. This makes attachment of the wire-bonds 214 to the contacts 222 increasingly difficult which, in turn, tends to limit the ability to shrink the overall package further.

DETAILED DESCRIPTION

A. Overview

Figure 1:
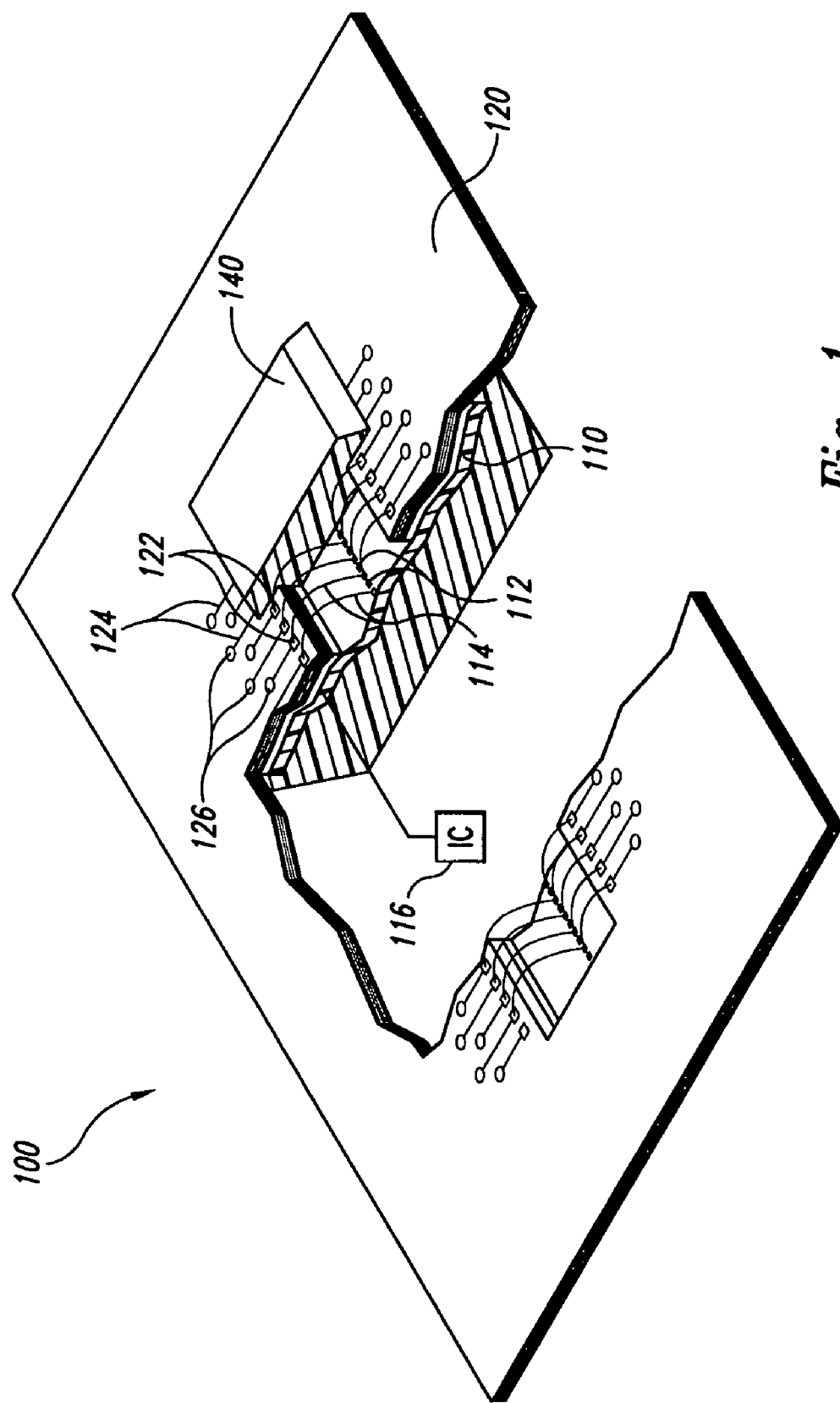
FIG. 1 is a partially cut-away isometric view of a packaged microelectronic device configured in accordance with the prior art.
Figure 2:
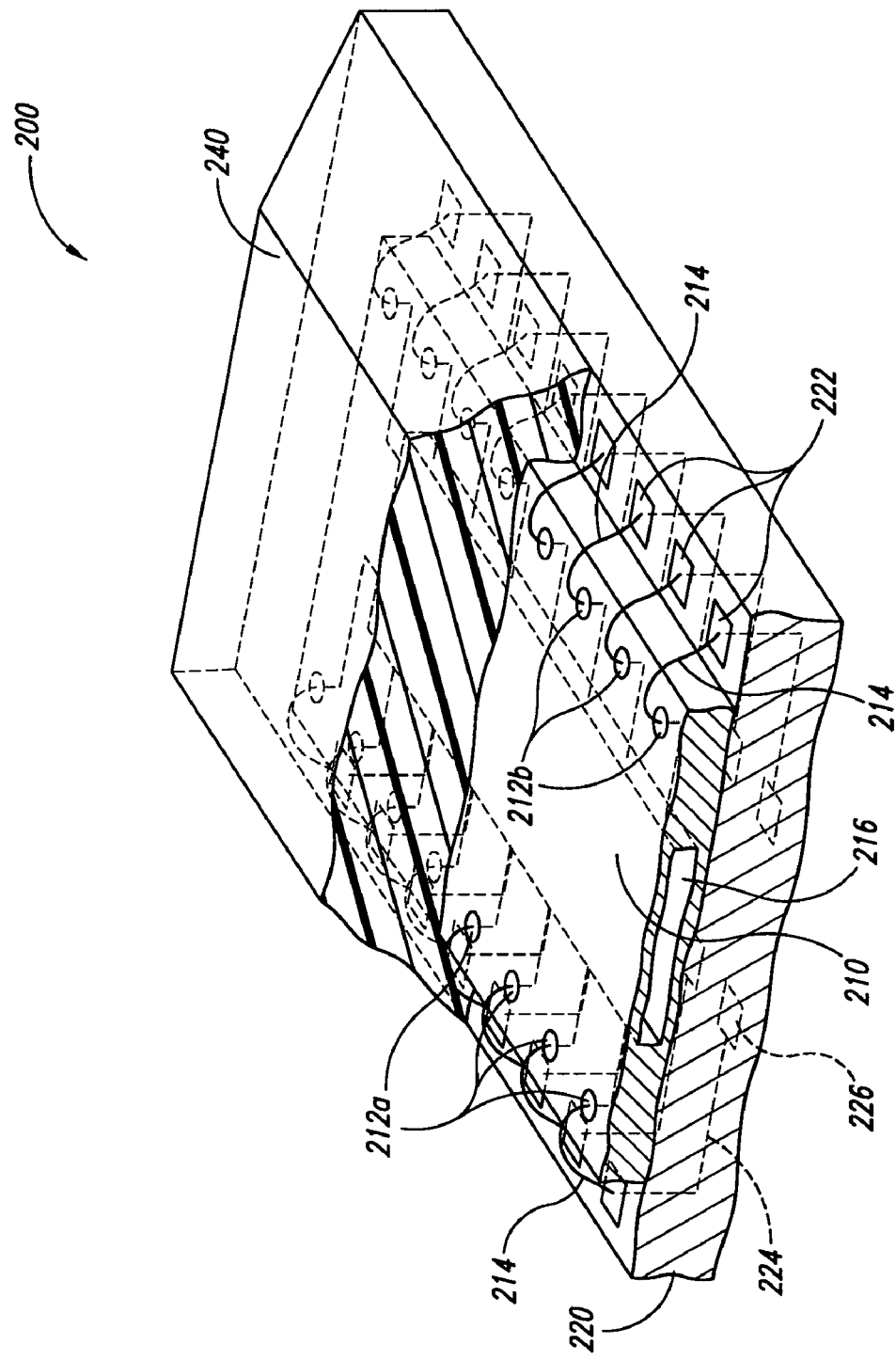
FIG. 2 is a partially cut-away isometric view of another packaged microelectronic device configured in accordance with the prior art.

The following disclosure describes several embodiments of microelectronic devices and/or interconnecting substrates having intermediate contacts. The following disclosure also describes several embodiments of methods for packaging microelectronic devices having intermediate contacts. One aspect of the invention is directed toward a microelectronic device having a first surface, a second surface positioned opposite to the first surface, and an integrated circuit positioned at least partially between the first and second surfaces. The microelectronic device further includes a plurality of terminals, a plurality of first contacts, and a plurality of second contacts. The terminals are positioned on the first surface of the microelectronic device and are electrically coupled to the integrated circuit. The first contacts are positioned on the first surface to one side of the terminals, and the second contacts are positioned on the first surface to the other side of the terminals. Each of the terminals is electrically coupled to a corresponding contact by, for example, a corresponding wire-bond. In one embodiment, the microelectronic device can further include an insulating layer that is attached to the first surface and carries the first and second contacts.

Another aspect of the invention is directed to a packaged microelectronic device that includes a plurality of first contacts supported by a microelectronic die and a plurality of second contacts supported by an interconnecting substrate. The microelectronic die includes a plurality of terminals electrically coupled to an integrated circuit. A plurality of wire-bonds individually couples each of the terminals to a corresponding one of the first contacts on the die. In one embodiment, each of the first contacts on the die faces a corresponding second contact on the interconnecting substrate. In this embodiment, a conductive coupler can extend between each pair of adjacent contacts to electrically connect the die to the interconnecting substrate.

A further aspect of the invention is directed to a method of manufacturing a packaged microelectronic device. The method includes providing a microelectronic die having a plurality of terminals electrically coupled to an integrated circuit. The method further includes forming a plurality of first contacts adjacent to the terminals, and electrically coupling each of the first contacts to a corresponding one of the terminals. In one embodiment, forming a plurality of first contacts adjacent to the terminals can include forming the first contacts on an insulating layer that is laminated to the die. In another embodiment, electrically coupling each of the first contacts to one of the terminals can include attaching a wire-bond from each of the first contacts to a corresponding one of the terminals. The method additionally includes forming a plurality of second contacts on an interconnecting substrate, and positioning the interconnecting substrate so that the second contacts on the substrate face the first contacts on the microelectronic die. The method then includes electrically coupling each of the first contacts on the die to a corresponding one of the second contacts on the interconnecting substrate. In one embodiment, electrically coupling the first contacts to the second contacts can include forming a solder ball or bump between opposing contacts.

Specific details of several embodiments of the invention are described below with reference to FIGS. 3-8 to provide a thorough understanding of such embodiments. Other details describing well-known structures often associated with microelectronic devices and interconnecting substrates are not set forth in the following description, however, to avoid unnecessarily obscuring the description of the various embodiments. Those of ordinary skill in the art will understand that the invention may have other embodiments in addition to those described below. Some of these embodiments may lack one or more of the elements or features shown or described below with reference to FIGS. 3-8. Alternatively, other of these embodiments may include additional elements or features that are not shown or described below.

The term "microfeature workpiece" is used throughout to include substrates upon which and/or in which microelectronic devices, micromechanical devices, data storage elements, optics, and other features are fabricated. For example, microfeature workpieces can be semiconductor wafers, glass substrates, dielectric substrates, or many other types of substrates. Many features on such microfeature workpieces have critical dimensions less than or equal to 1 µm, and in many applications the critical dimensions of the smaller features are less than 0.25 µm or even less than 0.1 µm.

Where the context permits, singular or plural terms may also include the plural or singular term, respectively. Moreover, unless the word "or" is expressly limited to mean only a single item exclusive from other items in reference to a list of at least two items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same features and/or types of other features and components are not precluded.

Figure 3:
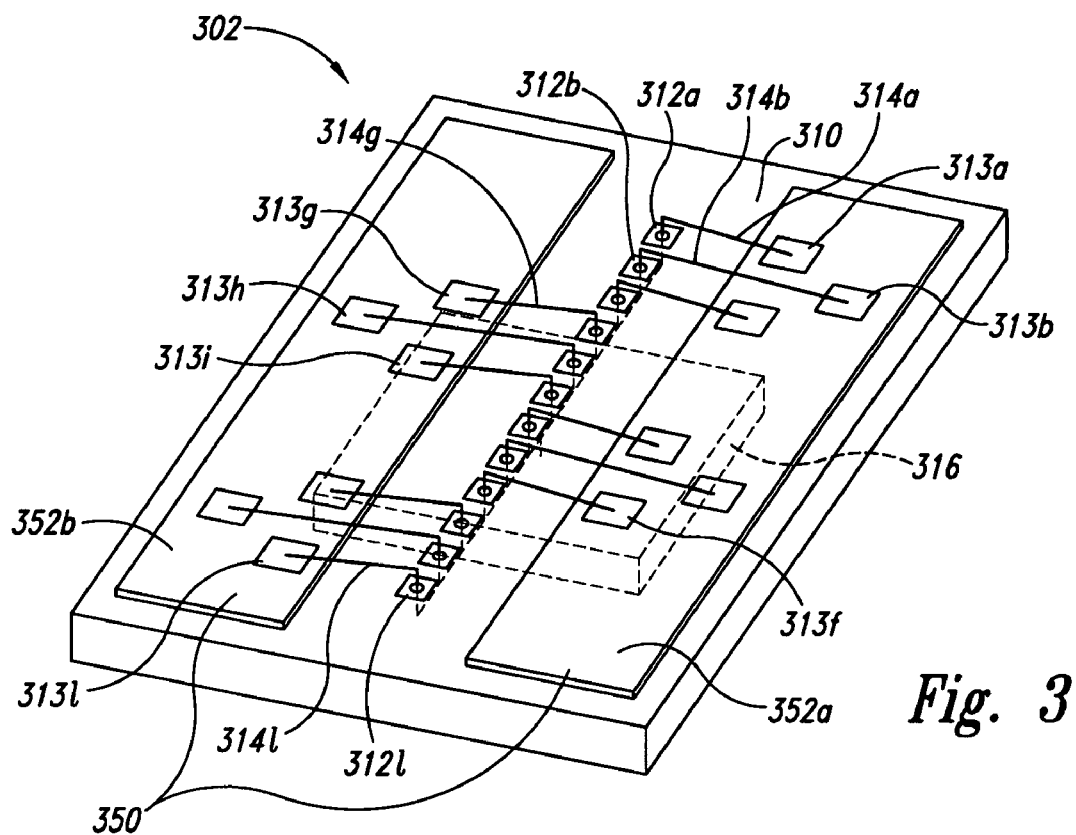
FIG. 3 is an isometric view of a microelectronic device configured in accordance with an embodiment of the present invention.

B. Embodiments of Intermediate Contacts for Microelectronic Devices with Centrally Arranged Terminals FIG. 3 is an isometric view of a microelectronic device 302 having a plurality of intermediate contacts 313a-l configured in accordance with an embodiment of the invention. In this embodiment, the microelectronic device 302 includes a microelectronic die 310 having a plurality of centrally-arranged terminals (e.g., bond-pads) 312a-l electrically coupled to an integrated circuit 316. The microelectronic die 310 can be a memory device, processing device, routing device, imager or other type of microelectronic device known in the art. The intermediate contacts 313 are divided into a plurality of first contacts 313a-f positioned on one side of the terminals 312, and plurality of second contacts 313g-l positioned to the other side of the terminals 312. Each of the contacts 313 is electrically coupled to a corresponding terminal 312 by an individual wire-bond 314.

In the illustrated embodiment, the first contacts 313a-f are carried on a first insulating layer portion 352a which is laminated to the die 310 on one side of the terminals 312, and the second contacts 313g-l are carried on a second insulating layer portion 352b which is laminated to the die 310 on the other side of the terminals 312. In this embodiment, the insulating layer portions 352 can represent an intermediate substrate 350 that is attached to the surface of the die 310. The insulating layer portions 352 can be manufactured from BT resin, FR4, Polyimide Flex, and/or other suitable dielectric materials known in the art. The insulating layer portions 352 can electrically insulate the contacts 313 from the die 310, and can provide a suitable surface for forming the contacts 313 using conventional plating, patterning, and etching methods known in the art. In other embodiments, however, it is expected that the insulating portions 352 can be omitted and the contacts 313 can be formed directly on the surface on the microelectronic die 310 using suitable methods known in the art. Such methods may include, for example, methods that are at least generally similar to those for forming redistribution layers at the wafer manufacturing level.

Figure 4:
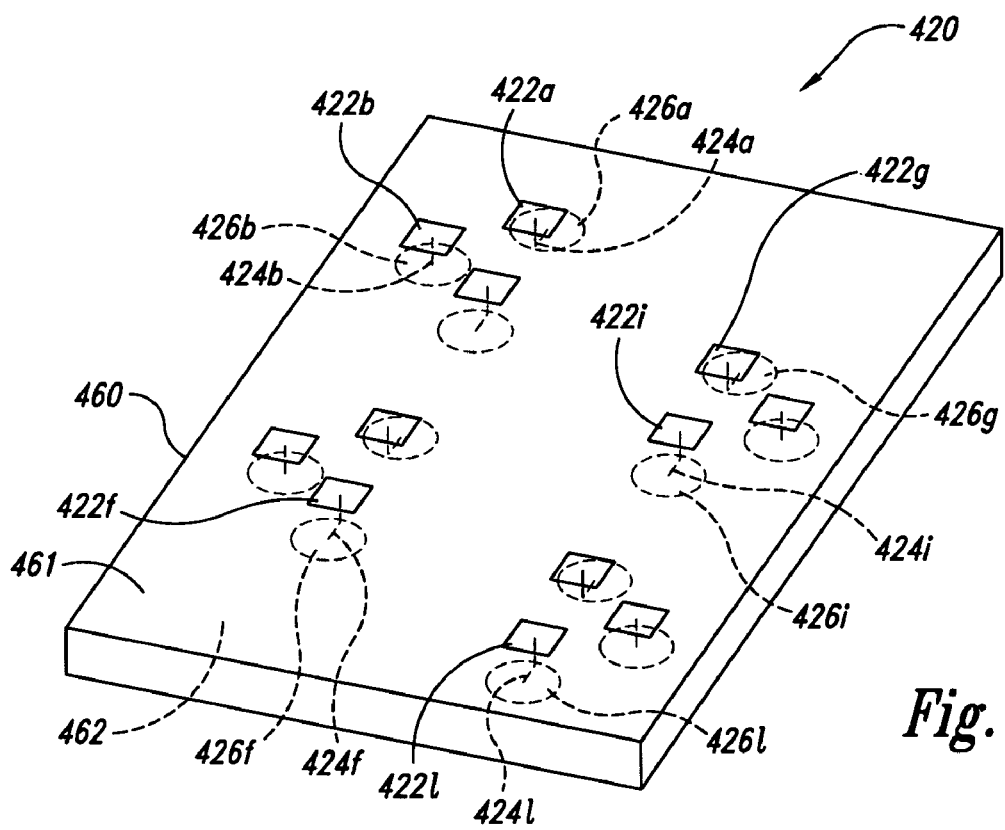
FIG. 4 is an isometric view of an interconnecting substrate configured in accordance with an embodiment of the invention.

FIG. 4 is an isometric view of an interconnecting substrate 420 having a plurality of intermediate contacts 422a-l configured in accordance with an embodiment of the invention. The interconnecting substrate 420 can be manufactured from a portion of non-conductive material 460 (e.g., FR4, BT resin, Polyimide Flex, or other suitable material known in the art) having a first surface 461 opposite to a second surface 462. The contacts 422 can be formed on the first surface 461 using suitable plating, patterning, and etching techniques (and/or other techniques) known in the art.

In one aspect of this embodiment, the intermediate contacts 422 are divided into a plurality of third contacts 422a-f and a plurality of fourth contacts 422g-l. Each of the contacts 422 is electrically coupled to a corresponding ball-pad 426 by a conductive line 424. The ball-pads 426 are positioned on the second surface 462, and the conductive lines 424 can accordingly include portions of through-vias, bond-fingers, conductive traces, and/or other elements suitable for making electrical connections on, over, or through non-conductive material. In another aspect of this embodiment, the plurality of third contacts 422a-f is arranged on one side of the first surface 461 in mirror-image of the first contacts 313a-f of FIG. 3, and the plurality of fourth contacts 422g-l is arranged on the other side of the first surface 461 in mirror-image of the second contacts 313g-l of FIG. 3. As described in greater detail below, this particular arrangement facilitates electrical coupling of the plurality of first contacts 313a-f to the plurality of third contacts 422a-f in one-to-one correspondence, and electrical coupling of the plurality of second contacts 313g-l to the plurality of fourth contacts 422g-l in one-to-one correspondence.

Figure 5:
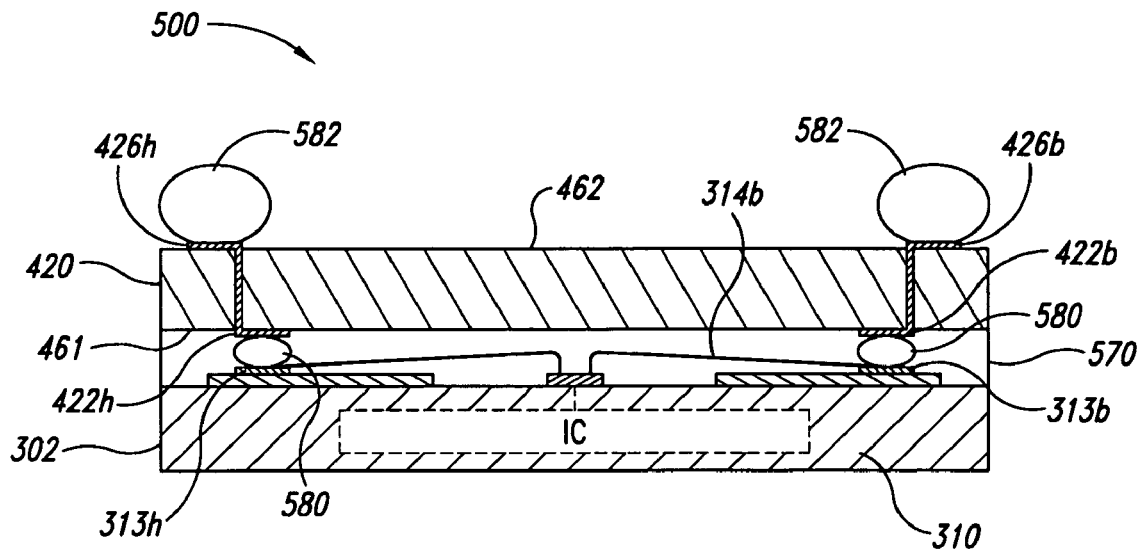
FIG. 5 is a cross-sectional view of a packaged microelectronic device configured in accordance with an embodiment of the invention.

C. Embodiments of Packaged Microelectronic Devices with Centrally Arranged Terminals FIG. 5 is a side cross-sectional view of a packaged microelectronic device 500 configured in accordance with an embodiment of the invention. In this view, the interconnecting substrate 420 is inverted relative to its orientation in FIG. 4 so that individual contacts 422 on the interconnecting substrate 420 are at least approximately aligned with corresponding contacts 313 on the microelectronic device 302. Conductive couplers 580 (e.g., solder balls or bumps) can then be reflowed to attach each of the contacts 313 to the adjacent contact 422. The conductive couplers 580 can include gold-to-gold solder and/or other flowable materials known in the art for electrically coupling contacts together in the illustrated manner. Once each of the contacts 313 has been electrically coupled to a corresponding contact 422, the space between the microelectronic device 302 and the interconnecting substrate 420 can be under-filled with a suitable mold compound 570 (e.g., epoxy or other flowable dielectric material known in the art) that bonds the microelectronic device 302 to the interconnecting substrate 420.

As shown in FIG. 5, a plurality of solder balls 582 can be suitably attached to the ball-pads 426 on the second surface 462 of the interconnecting substrate 420 to form a ball grid array suitable for attaching the packaged microelectronic device 500 to an associated PCB, PWA, and/or other type of electrical device or assembly.

One feature of the packaged microelectronic device embodiment described above with reference to FIG. 5 is that the contacts 313 are distributed over a relatively large area on the die 310. One advantage of this feature is that it reduces congestion on the second surface 462 of the interconnecting substrate 420 by enabling the contacts 422 to be placed on the first surface 461. Reducing congestion on the second surface 462 can make it easier to reduce the overall size of the device package 500. A further advantage of this feature is that it eliminates the need for wire-bonds between the die terminals 312 and contacts on the interconnecting substrate 420.

Figure 6:
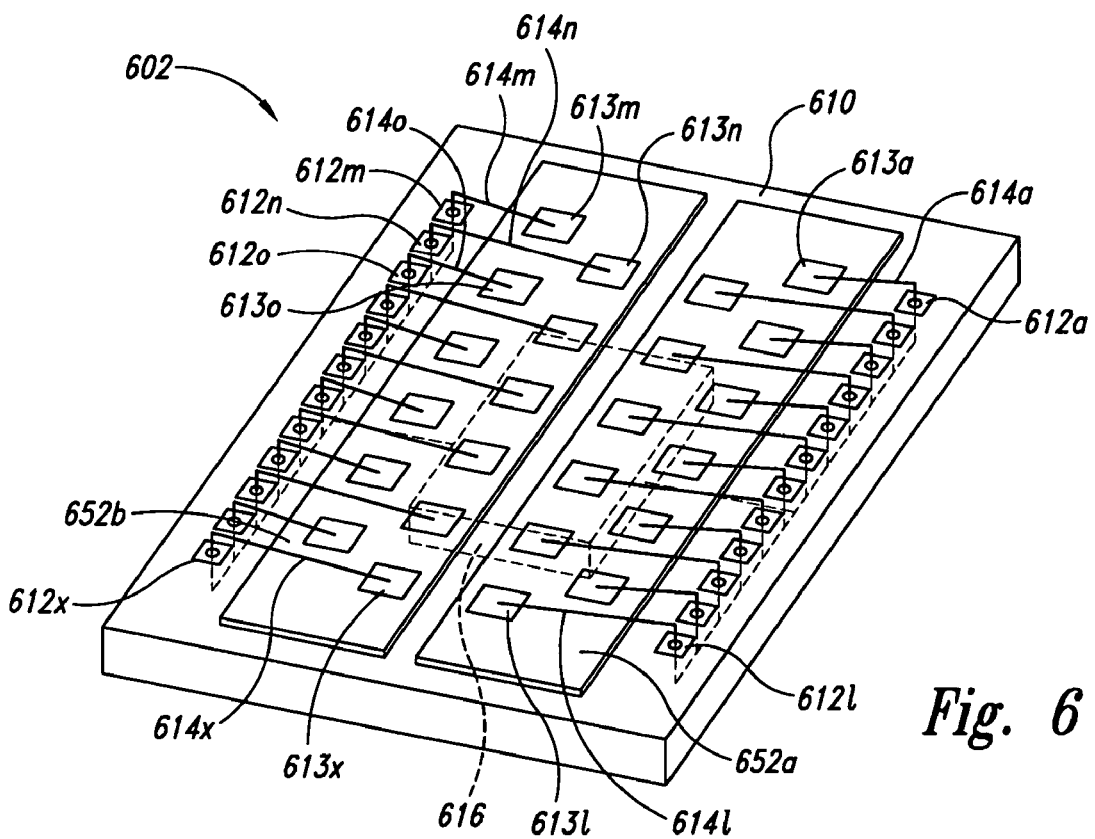
FIG. 6 is an isometric view of a microelectronic device configured in accordance with another embodiment of the invention.

D. Embodiments of Intermediate Contacts for Microelectronic Devices with Peripherally Arranged Terminals FIG. 6 is an isometric view of a microelectronic device 602 configured in accordance with another embodiment of the invention. Many features of the microelectronic device 602 are at least generally similar in structure and function to corresponding features of the microelectronic device 302 discussed above with reference to FIG. 3. For example, the microelectronic device 602 includes a microelectronic die 610 having an integrated circuit 616 electrically coupled to a plurality of terminals (e.g., bond-pads) 612a-x. In the illustrated embodiment, however, the terminals 612a-x are divided into a plurality of first terminals 612a-l positioned on one side of the microelectronic die 610, and a plurality of second terminals 612m-x positioned on the other side of the microelectronic die 610. Such an arrangement of terminals is typical of that found on microelectronic dies attached to interconnecting substrates in COB arrangements.

The microelectronic device 602 further includes a plurality of first contacts 613a-l, and a plurality of second contacts 613m-x, positioned between the plurality of first terminals 612a-l and the plurality of second terminals 612m-x. In the illustrated embodiment, the plurality of first contacts 613a-m is carried by a first insulating layer portion 652a, and the plurality of second contacts 613m-x is carried by a second insulating layer portion 652b. The insulating layer portions 652 can be laminated or otherwise attached to the surface of the die 610, and can include FR4, BT resin, Polyimide Flex, and/or other suitable dialectric materials known in the art. Each of the first terminals 612a-l is electrically coupled to a corresponding one of the first contacts 613a-l by an individual wire-bond 614a-l. Similarly, each of the second terminals 612m-x is electrically coupled to a corresponding one of the second contacts 613m-x by an individual wire-bond 614m-x.

Figure 7:
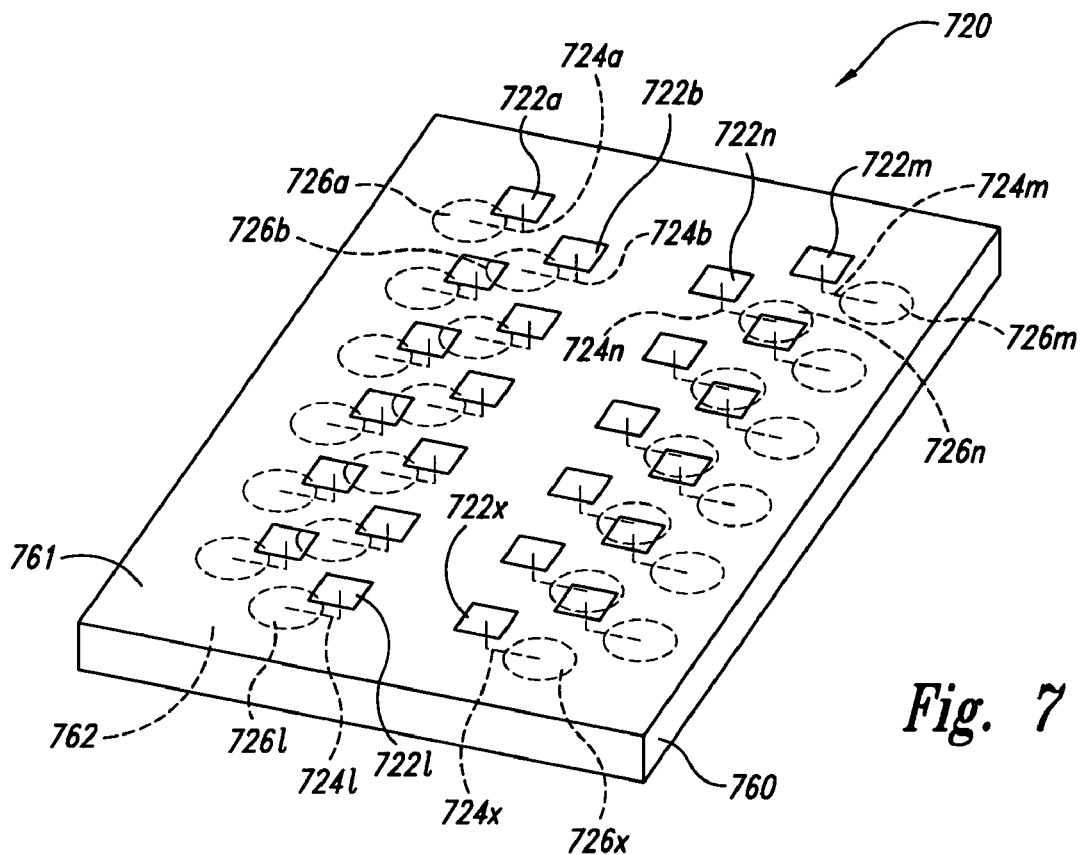
FIG. 7 is an isometric view of an interconnecting substrate configured in accordance with another embodiment of the invention.

FIG. 7 is an isometric view of an interconnecting substrate 720 configured in accordance with another embodiment of the invention. Many features of the interconnecting substrate 720 are at least generally similar in structure and function to the interconnecting substrate 420 described above with reference to FIG. 4. For example, the interconnecting substrate 720 includes a non-conductive material 760 having a first surface 761 opposite to a second surface 762. Further, the interconnecting substrate 720 includes a plurality of third contacts 722a-l, and a plurality of fourth contacts 722m-x, formed on the first surface 761 of the non-conductive material 760. In the illustrated embodiment, the third contacts 722a-l are arranged in a pattern that at least approximately mirrors the pattern of first contacts 613a-l on the die 610 of FIG. 6. Similarly, the fourth contacts 722m-x are arranged in a pattern that at least approximately mirrors the pattern of second contacts 613m-x on the die 610. Each of the third and fourth contacts 722 is electrically coupled to a corresponding ball-pad 726 by an individual conductive line 724 that extends at least partially through the non-conductive material 760.

Figure 8:
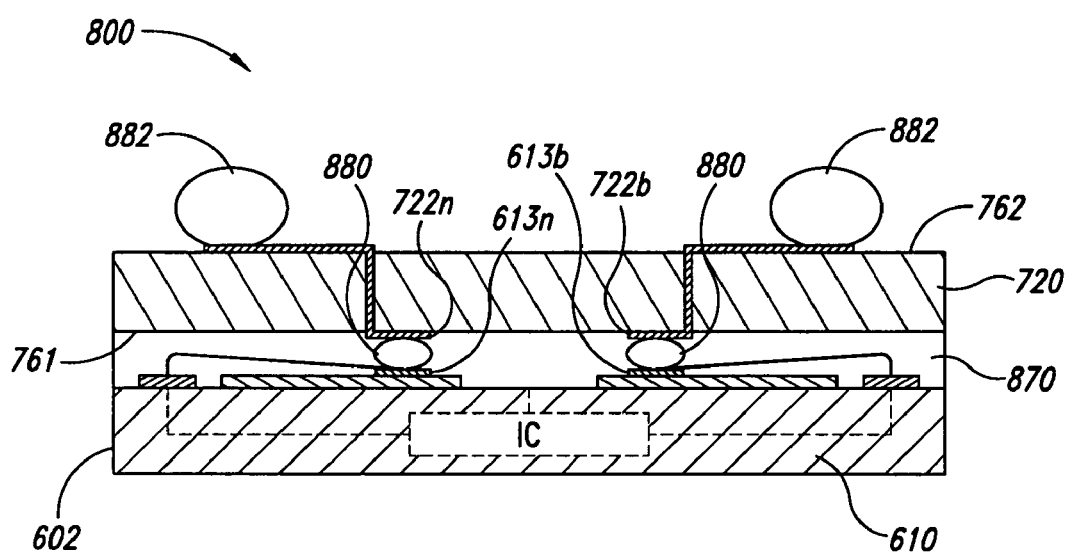
FIG. 8 is a cross-sectional view of a packaged microelectronic device configured in accordance with another embodiment of the invention.

C. Embodiments of Packaged Microelectronic Devices with Peripherally Arranged Terminals FIG. 8 is a side cross-sectional view of a packaged microelectronic device 800 configured in accordance with another embodiment of the invention. In this embodiment, the interconnecting substrate 720 is inverted so that each of the third contacts 722a-l on the substrate 720 faces a corresponding first contact 613a-l on the die 610, and each of the fourth contacts 722m-x on the substrate 720 faces a corresponding second contact 613m-x on the die 610. When the interconnecting substrate 720 and the microelectronic device 602 are in these positions, conductive couplers (e.g., solder bumps) 880 positioned between adjacent contacts can be reflowed to electrically connect the contacts together. After the conductive couplers 880 have been reflowed, the space between the interconnecting substrate 720 and the microelectronic device 602 can be suitably filled with a mold compound, epoxy, adhesive, and/or other material to bond the parts together and/or protect the electrical interconnections.

One feature of the packaged microelectronic device embodiment described above with reference to FIG. 8 is that the contacts 613 are distributed over a relatively large area on the die 610 inboard of the corresponding terminals 612. One advantage of this feature is that it reduces congestion on the second surface 762 of the interconnecting substrate 720 because it enables the contacts 722 to be placed on the first surface 761. Another advantage of this feature is that it eliminates the need for peripheral wire-bonds that extend from the terminals 612 to bond pads on the interconnecting substrate 720, as would be found on conventional COB packages. Eliminating these wire-bonds can make it easier to reduce the overall size of the device package 800.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

I claim:

1. A microelectronic device comprising:
a microelectronic die, the microelectronic die including:
a first surface;
a second surface positioned opposite to the first surface;
an integrated circuit positioned at least partially between the first and second surfaces; and
a plurality of terminals positioned on the first surface and electrically coupled to the integrated circuit, wherein the plurality of terminals includes a plurality of first terminals and a plurality of second terminals, wherein the plurality of first terminals is aligned along one side of the first surface and the plurality of second terminals is aligned along the other side of the first surface;
a plurality of contacts supported by the first surface of the die and positioned adjacent to the terminals, wherein the plurality of contacts is positioned between the plurality of first terminals and the plurality of second terminals;
a plurality of wire-bonds, wherein each of the wire-bonds electrically couples one of the contacts to a corresponding terminal; and
a plurality of conductive couplers, wherein each of the conductive couplers is attached to a corresponding contact.

2. The microelectronic device of claim 1 wherein the plurality of contacts includes a plurality of first contacts and a plurality of second contacts, wherein the plurality of first contacts is supported by the first surface of the die and positioned proximate the plurality of first terminals, and wherein the plurality of second contacts is supported by the first surface of the die and positioned proximate the plurality of second terminals, wherein the plurality of wire-bonds includes a plurality of first wire-bonds and a plurality of second wire-bonds, wherein individual first wire-bonds extend inwardly in a first direction from individual first terminals toward individual first contacts, and wherein individual second wire-bonds extend inwardly in a second direction, opposite to the first direction, from individual second terminals toward individual second contacts.

3. The microelectronic device of claim 1, further comprising an insulating layer attached to the first surface of the die, wherein the insulating layer carries the plurality of contacts.

4. The microelectronic device of claim 1 wherein the plurality of contacts includes a plurality of first contacts and a plurality of second contacts, wherein the plurality of wire-bonds includes a plurality of first wire-bonds and a plurality of second wire-bonds, wherein the plurality of conductive couplers includes a plurality of first conductive couplers and a plurality of second conductive couplers, and wherein the microelectronic device further comprises:
a first insulating layer portion laminated to the first surface of the die on one side of the plurality of first terminals, wherein the first insulating layer portion carries the plurality of first contacts;
a second insulating layer portion laminated to the first surface of the die on the other side of the plurality of second terminals, wherein the second insulating layer portion carries the plurality of second contacts;
wherein each of the first wire-bonds electrically couples one of the first contacts to a corresponding first terminal, and each of the second wire-bonds electrically couples one of the second contacts to a corresponding second terminal; and
wherein each of the first conductive couplers is attached to a corresponding first contact, and each of the second conductive couplers is attached to a corresponding second contact.

5. The microelectronic device of claim 1, further comprising an insulating layer portion attached to the first surface of the die between the plurality of first terminals and the plurality of second terminals, wherein the insulating layer portion carries the plurality of contacts.

6. The microelectronic device of claim 1 wherein the each of the conductive couplers includes reflowable, conductive material.

7. The microelectronic device of claim 1 wherein the each of the conductive couplers is a conductive bump.

8. The microelectronic device of claim 1 wherein the each of the conductive couplers is a solder ball.

9. A microelectronic device comprising:
a microelectronic die, the microelectronic die including:
a first surface;
a second surface positioned opposite to the first surface;

an integrated circuit positioned at least partially between the first and second surfaces; and a plurality of terminals positioned on the first surface and electrically coupled to the integrated circuit, wherein the plurality of terminals includes a plurality of first terminals and a plurality of second terminals, wherein the plurality of first terminals is positioned to one side of the first surface of the die and the plurality of second terminals is positioned to the other side of the first surface of the die;

an intermediate substrate attached to the first surface of the microelectronic die, wherein the intermediate substrate includes:

a plurality of contacts positioned between the plurality of first terminals and the plurality of second terminals, wherein each of the contacts is electrically coupled to a corresponding terminal; and a plurality of solder balls, wherein each of the solder balls is positioned on a corresponding contact.

10. The microelectronic device of claim 9, further comprising a plurality of wire-bonds, wherein each of the contacts on the intermediate substrate is electrically coupled to a corresponding terminal with one of the wire-bonds.

11. The microelectronic device of claim 9 wherein the plurality of contacts includes a plurality of first contacts positioned to one side of the first terminals and a plurality of second contacts positioned to the opposite side of the second terminals.

12. The microelectronic device of claim 9 wherein the plurality of contacts includes a plurality of first contacts positioned to one side of the first terminals and a plurality of second contacts positioned to the opposite side of the second terminals, wherein the plurality of solder balls includes a plurality of first solder balls and a plurality of second solder balls, wherein each of the first solder balls is positioned on a corresponding first contact and each of the second solder balls is positioned on a corresponding second contact, and wherein the microelectronic device further comprises:

a plurality of first wire-bonds electrically coupling each of the first contacts to a corresponding first terminal; and a plurality of second wire-bonds electrically coupling each of the second contacts to a corresponding second terminal.

13. The microelectronic device of claim 9, further comprising:

a plurality of first wire-bonds electrically coupling each of the first terminals to a corresponding one of the contacts; and a plurality of second wire-bonds electrically coupling each of the second terminals to a corresponding one of the contacts.

* * * * *